United States Patent [19]

Gerlach

[11] 4,345,152

[45] Aug. 17, 1982

[54] MAGNETIC LENS

[75] Inventor: Robert L. Gerlach, Minnetonka, Minn.

[73] Assignee: The Perkin-Elmer Corporation, Norwalk, Conn.

[21] Appl. No.: 176,735

[22] Filed: Aug. 11, 1980

[51] Int. Cl.³ .............................................. H01J 3/14
[52] U.S. Cl. .......................................... 250/396 ML
[58] Field of Search ...................... 250/396 ML, 311; 313/11, 431, 433

[56] References Cited

U.S. PATENT DOCUMENTS 2,323,328 7/1943 Hillier .
3,500,269 3/1970 Katagiri et al. ............. 250/396 ML
4,205,226 5/1980 Gerlach .

FOREIGN PATENT DOCUMENTS 1614693 8/1978 Fed. Rep. of Germany ...... 250/396 ML

Primary Examiner—Bruce C. Anderson
Attorney, Agent, or Firm—S. A. Giarratana; F. L. Masselle; R. A. Hays

[57] ABSTRACT

A magnetic lens, useful as an objective lens in a focused charged particle beam generator, includes means for maintaining a constant thermal power dissipation independent of the field strength produced thereby.

6 Claims, 4 Drawing Figures

MAGNETIC LENS

BACKGROUND OF THE INVENTION

The present invention generally relates to a magnetic lens and, in particular, relates to a magnetic lens having a preselected thermal power dissipation independent of the strength of its magnetic field.

Magnetic lenses are generally known and are often employed to focus a beam of charged particles i.e. electrons or ions. One major use of a magnetic lens is in analytical instruments which utilize focused electron beams to stimulate a measurable reaction from a sample of material which is being elementally analyzed. In such instruments the magnetic lens is useful as an objective, or final focusing control. That is, the objective magnetic lens is the last beam diameter control element prior to the beam impinging on the sample. As such, the stability of the beam position as affected by the magnetic lens is quite critical to achieve an accurate characterization of small features on the sample.

One feature of conventional analytical instruments employing an electron beam is that the energy of the electron beam is variable over a range of energies consistent with the range of materials to be characterized. For example, in an Auger analysis, the energy of the electron beam determines the depth of penetration and the range of Auger excitation of the atoms of the sample. Since the energy necessary to produce Auger electrons varies from atom to atom, a beam generator, to be effective, must be capable of producing electrons of various energies. In addition, the beam energy must be variable if the sample under analysis is an insulator, if the beam energy is sufficiently high, can become electrostatically charged. Such charging can be avoided by reducing the beam energy, sometimes to as low as 2 KeV. Another instance which mandates a variable beam energy is where an X-ray detector is used. In order to produce atomic emissions in the X-ray spectrum, the energy of the charged particle beam must be quite high, for example, on the order of about 30 KeV. Thus, to be practical, the energy of, for example, an electron beam should be variable over a broad energy range.

As one might expect, however, when the beam energy or beam size is changed, the strength of the magnetic field of the magnetic lens must also be adjusted in order to ensure that the beam having the changed energy remains focused on the same point of the sample as the beam of previous energy. In conventional magnetic lenses, the strength of the magnetic field is controlled by the current passing through a single coil of wire defining an electromagnet.

It is well known that one major consideration in the design of a magnetic lens is the removal and dissipation of the thermal power generated thereby. If the power dissipation mechanism is not sufficient, the position of the beam drifts until equilibrium is reached. In most instances, the reaction time of the thermal dissipation mechanism is inadequate to readily keep pace with the thermal changes in the magnetic lens caused by changing the strength of the magnetic field in response to a change in beam energy.

One known mechanism used to stabilize the temperature of a magnetic lens is to introduce a water cooling jacket around the lens. Such a mechanism, while substantially effective, is nevertheless cumbersome, not only in its initial design but also in its implementation. In addition, cooling systems in general often require frequent maintenance and repair due, in part, to impurities and corrosive material in the working fluid. Hence, the reliability of such cooling means is questionable thereby reducing the reliability of the entire instrument.

Hence, conventional magnetic lenses can require an extraordinary amount of time to stabilize whenever the beam energy is changed. This problem causes a considerable loss of time during the analysis of a single sample.

SUMMARY OF THE INVENTION

In accordance with the above discussion, it is on object of the present invention to provide a magnetic lens having means for maintaining a preselected thermal power dissipation level which is independent of the strength of the magnetic field of the lens.

It is another object of this invention to provide such a magnetic lens by including therein an electromagnet defined by a pair of coils.

These and other objects and advantages will become apparent from the following drawing and description of a detailed embodiment.

DETAILED DESCRIPTION OF INVENTION

Figure 1:
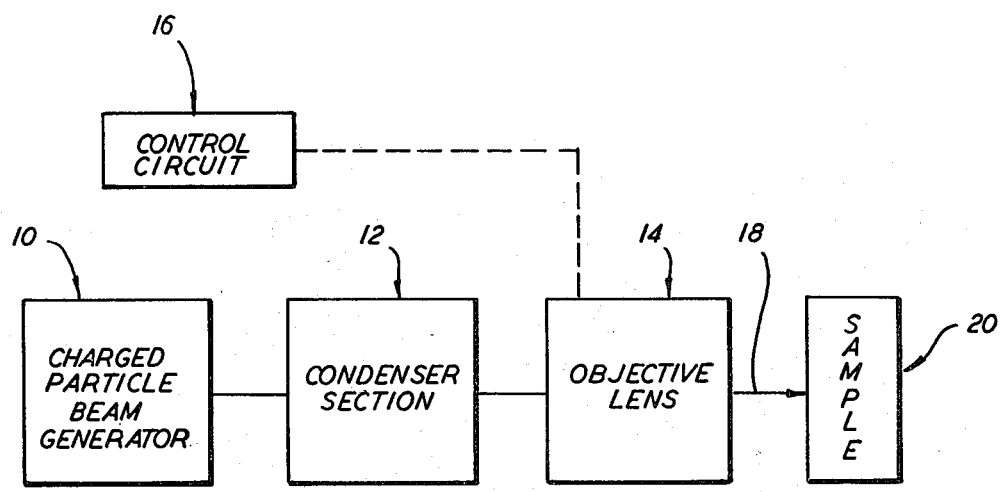
FIG. 1 is a block diagram of the basic elements of a focused charged particle beam system.

A focused charged particle beam generator is depicted in block diagram form in FIG. 1. As shown therein the relevant components are a charged particle beam generator 10, a condenser section 12 and an objective magnetic lens 14. The charged particle beam generator 10 can be any conventional arrangement known in the art although in this embodiment it is an electron beam generator comprising a thermoionic filament fabricated from lanthanum hexaboride. In the preferred embodiment, the energy of the beam is selected and controlled by a preprogrammed control circuit 16. The beam of electrons is than passed through the condenser section 12 to demagnify the beam and thereby concentrate the energy thereof. The use of a condenser section 12 is optional and, when included, can include one or more electrostatic or magnetic lenses. The beam in then directed through the magnetic lens 14 which further demagnifies and also focuses the beam to about 500 Å diameter. The magnetic lens 14, designed according to the principles of the present invention, is used, in this embodiment, as an objective lens although it could also be used as a part of the condenser section 12. The focused beam 18 is thus directed to a rather small segment of the surface of the sample 20 being analyzed.

Figure 2:
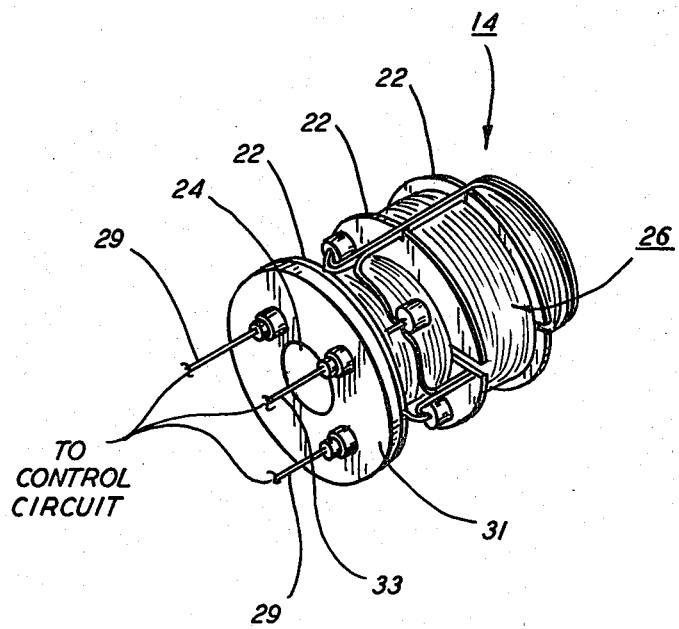
FIG. 2 is a perspective view of one embodiment of a magnetic lens, not drawn to scale, embodying the principles of the present invention.

As shown in FIG. 2, the magnetic lens 14 includes a base 22 having an aperture 24 therethrough. Preferably the base 22 is a spool-like structure formed of a thermally conductive material such as copper. The spool-like structure is thermally connected to a heat sink (not shown in the drawing). A coil 26 of wire is concentrically wrapped around the base 22 to form an electromagnet. The strength of the magnetic field in the aperture 24 of the base 22 is dependent upon the total effective current passing through the electromagnetic coil 26 from a power supply (not shown). As well known in the art, the lens 14 can be provided with a magnetic shield thereabout to concentrate and confine the magnetic field to the aperture 24. As more fully discussed below, the current provided to the coil 26 can also be controlled by the preprogrammed control circuit 16.

The coil 26 is comprised of at least a pair of sub-coils 28A and 28B which are electrically in parallel whereby the individual currents of each sub-coil are algebraically additive to produce a total current. While the sub-coils 28A and 28B can be distinct segments of the coil 26, it is preferred that they are effectively overlapping. Such an arrangement can be accomplished by defining the coil 26 by wrapping a pair of adjacent, but electrically insulated conductors 29, around the base 22. By thus arranging the sub-coils 28A and 28B, the thermal dissipation therefrom the coil 26 is more uniform. The conductors 29 are fed through one end 31 of the base 22 and are connected to the control circuit 16. As shown, the sub-coils 28A and 28B have a common electrical lead 33 which creates the desired electrical parallel configuration.

Figure 3:
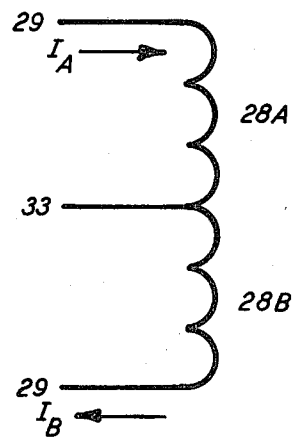
FIG. 3 is an equivalent circuit representative of the magnetic lens shown in FIG. 2.

The pair of sub-coils 28A and 28B are diagrammatically shown in FIG. 3. For the purpose of this discussion, only the magnetic field generating currents are represented. As well known in the art, the currents of the sub-coils 28A and 28B, which coils are electrically in parallel with each other, are algebraically summed to produce a total current which sets up the beam controlling magnetic field in the aperture 24. The total current through the coil 26 is $I_T = I_A + I_B$; wherein $I_A$ is the current through sub-coil 28A and $I_B$ is the current through sub-coil 28B. The thermal power dissipated by the coil 26 is $P_T = P_A + P_B$. By known substitution, it is determined that the total thermal power produced is $P_T = I_A^2 R_A + I_B^2 R_B$, wherein $R_A$ is the ohmic resistance of sub-coil 28A and $R_B$ is the ohmic resistance of the sub-coil 28B. In the preferred embodiment, the sub-coils 28A and 28B are equal in length and if the conductors 29 of each are of the same material and cross-section, the resistances, i.e. $R_A$ and $R_B$, are equal.

From a practical viewpoint, the formulas above demonstrate that the magnetic field strength which is dependent upon $I_T$ can be varied by varying the relative magnitude and direction of $I_A$ and $I_B$ which are effectively algebraically summed. Additionally the total power dissipation which, while independent of the direction of $I_A$ and $I_B$, is dependent only on the magnitudes, i.e., the absolute value, thereof and remains constant.

From the formulas above, it can be shown that $$I_A = \tfrac{1}{2} I_T - \tfrac{1}{2}(I_M^2 - I_T^2)^{\frac{1}{2}}$$

and $$I_B = \tfrac{1}{2} I_T + \tfrac{1}{2}(I_M^2 - I_T^2)^{\frac{1}{2}}$$

wherein:

$$I_M^2 = 2 P_T / R.$$

As more fully discussed below, $I_M$ is the maximum current necessary to provide the lens 14 with the maximum magnetic field strength required for a given test.

Figure 4:
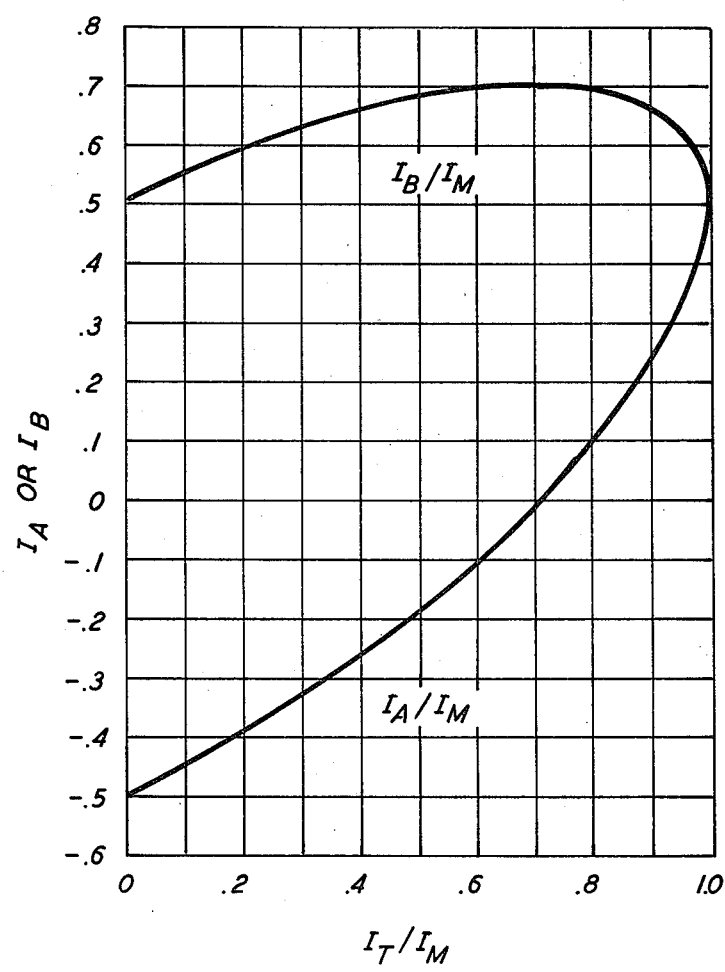
FIG. 4 is a graphic representation of the relevant current conditions for operating a magnetic lens designed according to the principles of the present invention.

The solutions to the two quadratic equations are plotted in graphic form in FIG. 4. As shown, the value of $I_A$ or $I_B$ is plotted against the total current, $I_T$, normalized to $I_M$. Thus the normalized values of $I_A$ and $I_B$, i.e. $I_A/I_M$ and $I_B/I_M$ respectively, are given for each $I_T$ required. In a scan of electron beam energies, for example from 2 KeV to 30 KeV, the value of $I_T/I_M$ ranges from approximately 0.1 to about 0.95. Preferably the maximum current, $I_M$, to be used in a given test is selected to be slightly higher than the $I_T$ required so that $I_T/I_M$ is always less than 1.0. By such a selection of $I_M$, the operation of the lens 14 with a constant thermal power dissipation throughout the entire scan of beam energies is ensured. The selection of $I_T$ determines the thermal power dissipated by the magnetic lens 14.

In one specific lens 14, the spool-like base 22 has an aperture diameter of about 2 cm, and outside diameter of about 7 cm, and a length of about 6 cm. In this instance, the lens 14 consists of about 600 turns of #24AWG, Type ML, Class 220 dual conductor copper wire. In this example, the electron beam energy is operational between 2 KeV and 30 KeV. In order to maintain a maximum beam diameter of about 500 A, the total current $I_T$ passing through the sub-coils 28A and 28B must create a maximum magnetic field strength on the order of about 500 gauss.

In operation, the electron beam generator, embodying a magnetic lens designed according to the principles of this invention as an objective lens, is switched on and allowed to stabilize, which stabilization can ordinarily take about a day. Initially, the magnetic lens 14 is energized, with a current equal to $I_T$, so that the thermal power dissipated thereby is equal to the maximum amount which will be required during the particular test desired. For example, if the energy of the electron beam is to scan from 2 KeV through 30 KeV, the thermal power dissipated in focusing the 30 KeV beam is the maximum and the lens 14 is adjusted therefor. The currents $I_A$ and $I_B$ of the sub-coils 28A and 28B, respectively, are adjusted to not only provide a magnetic field of the strength required to focus the highest energy beam to be used but more importantly, the currents $I_A$ and $I_B$ are adjusted throughout the test to maintain the preselected constant thermal power dissipation. The values of $I_A$ and $I_B$ necessary to maintain the required $I_T$ can be determined via the solution of the above quadratic equations or derived from the graph of FIG. 4. However, in a practical sense, the most advantageous mechanism to control the currents $I_A$ and $I_B$ is a computer mechanism. Thus, the control circuit 16 can be a preprogrammed micro-processor, a mini-computer or the like, which is programmed to sense, as an input, the electron beam energy and adjust the currents $I_A$ and $I_B$ so that the lens 14 not only produces the proper magnetic field but also maintains the preselected thermal power dissipation. Additionally, the function of the control circuit 16 can be expanded to controlling the beam energy and other functions of the analytical instrument. Hence, by substantially completely eliminating thermal perturbation in the system, the testing of a sample 20 with a focused electron beam generator can be performed in almost a continuous scan of beam energies with minimal loss of time due to system restabilization.

While a magnetic lens embodying the principles of the present invention has been described above in an exemplary specific embodiment, it is not to be considered as limiting the scope and spirit of the invention. The scope of the present invention is defined by the appended claim and the reasonable interpretation thereof.

What is claimed is:

1. A magnetic lens useful in a charged particle beam generator comprising:

a base having an aperture therethrough, said aperture being axially aligned with the beam produced by said generator;

means, for producing a controllable magnetic field in said aperture of said base and simultaneously maintaining a preselected thermal power dissipation independent of the strength of said magnetic field, said means being an electromagnetic coil concentric with said aperture and supported by said base; said coil including a pair of sub-coils the direction and magnitude of the currents of which are independently controllable; and means for controlling said magnetic field by varying the algebraic sum of said currents in said sub-coils; and means for maintaining said preselected thermal power dissipated by maintaining the absolute value sum of said currents constant.

2. A lens as claimed in claim 1 wherein said coil is a wound pair of adjacent wires, which wires are electrically insulated from each other whereby each wire of said pair defines one of said sub-coils.

3. A lens as claimed in claim 1 wherein said charged particle beam generator is operable over a range of beam energies; and said strength of said magnetic field is cooperatively adapted to said beam energies.

4. A lens as claimed in claim 1 or 2 wherein said sub-coils are electrically parallel with each other.

5. A lens as claimed in claim 1 or 2 where said sub-coils have substantially equal resistances.

6. A lens as claimed in claim 1 or 2 wherein the magnitude and direction of said currents in said sub-coils is electronically controlled via a circuit having as an input thereto a signal representative of said beam energy.

* * * * *

UNITED STATES PATENT AND TRADEMARK OFFICE
CERTIFICATE OF CORRECTION

PATENT NO. : 4,345,152

DATED : August 17, 1982

INVENTOR(S) : Robert L. Gerlach

It is certified that error appears in the above-identified patent and that said Letters Patent are hereby corrected as shown below:

Column 2, line 66, change "copper" to --beryllium--.
Column 4, line 19, change "A" to --$\overset{\circ}{A}$--.

Signed and Sealed this

Thirty-first Day of May 1983

[SEAL]

Attest:

DONALD J. QUIGG

Attesting Officer      Acting Commissioner of Patents and Trademarks